United States Patent [19]

Reimers et al.

[11] Patent Number: 4,845,780
[45] Date of Patent: Jul. 11, 1989

[54] GLOVE HAVING IMPROVED CUFF SECURING FEATURES

[75] Inventors: James L. Reimers, Saratoga, Calif.; Peter S. Bernard, Bedford, N.Y.

[73] Assignee: Becton, Dickinson and Company, Franklin Lakes, N.J.

[21] Appl. No.: 181,009

[22] Filed: Apr. 13, 1988

[51] Int. Cl.$^4$ .......................................... A41D 19/00
[52] U.S. Cl. .......................................... 2/160; 2/169; 2/167; 2/161 R
[58] Field of Search ................. 2/19, 159, 160, 161 A, 2/161 R, 164, 167, 169; 220/404; 15/227; 294/1.3; 383/4; 119/95

[56] References Cited

U.S. PATENT DOCUMENTS

| | | | |
|---|---|---|---|
| Re. 31,538 | 3/1984 | Antonious . | |
| 2,030,135 | 2/1936 | Carpenter | 450/81 |
| 2,394,532 | 2/1946 | Shmikler | 2/159 |
| 2,453,604 | 11/1948 | Tenenbaum et al. | 2/ |
| 3,232,632 | 2/1966 | Lewis | 2/160 X |
| 3,382,138 | 5/1968 | Barth . | |
| 3,625,790 | 12/1971 | Ayres | 2/159 X |
| 3,728,739 | 4/1973 | Semp | 2/ |
| 3,740,262 | 6/1973 | Agostinelli | 2/169 |
| 3,852,826 | 12/1974 | Schindler . | |
| 3,866,245 | 2/1975 | Sutherland | 2/169 |
| 3,942,193 | 3/1976 | Pugh | 2/159 |
| 4,051,572 | 10/1977 | Greenwood | 2/159 X |
| 4,133,624 | 1/1979 | Heavner et al. . | |
| 4,214,321 | 7/1980 | Nuwayser | 2/161 R X |
| 4,224,692 | 9/1980 | Sundberg | 2/161 R |
| 4,329,312 | 5/1982 | Ganz | 2/161 R |
| 4,371,987 | 2/1983 | Brasfield . | |
| 4,371,988 | 2/1983 | Berend | 2/161 R X |
| 4,434,126 | 2/1984 | Mc Gary, Jr. et al. . | |
| 4,476,588 | 10/1984 | Long | 2/159 X |
| 4,526,828 | 7/1985 | Fogt et al. | 2/161 R X |
| 4,536,890 | 8/1985 | Barnett et al. | 2/161 R X |
| 4,643,791 | 2/1987 | Jurrius et al. | 2/159 X |
| 4,679,257 | 7/1987 | Town | 2/159 X |
| 4,745,635 | 5/1988 | Kinnear | 2/161 R |
| 4,752,093 | 6/1988 | Haber et al. | 294/1.3 |
| 4,768,818 | 9/1988 | Kolic | 294/1.3 |

FOREIGN PATENT DOCUMENTS 74162  1/1948  Norway ........................... 2/161 R

OTHER PUBLICATIONS

German Publication No. 2401866, Dated 3/1975 Country: Germany (West), Name: Damme et al.

Primary Examiner—Werner H. Schroeder
Assistant Examiner—Jeanette E. Chapman
Attorney, Agent, or Firm—John L. Voellmicke

[57] ABSTRACT

A disposable glove for medical use and the like includes a closed distal end for containing the wearer's fingers, and open proximal end, and a cuff portion at the open proximal end. A tab having a free end is provided at the cuff portion. Adhesive on a portion of the tab is capable of removably securing the free end of the tab to the cuff portion for tightening the cuff portion when the glove is on the wearer's hand. A method of making the glove is also disclosed.

25 Claims, 4 Drawing Sheets

GLOVE HAVING IMPROVED CUFF SECURING FEATURES

BACKGROUND OF THE INVENTION

1. Field of the Invention

The present invention relates to gloves and more particularly concerns disposable gloves for medical uses, prevention of disease transfer and the like.

2. Description of Related Information

Disposable gloves have been used extensively by doctors, nurses, hospital employees and laboratory technicians for many years. These gloves are used for surgical procedures, medical examinations, treating patients having contagious diseases, blood drawing, testing and transfusions, and numerous other surgical, examination, medical and laboratory procedures. Due to the increased concern regarding diseases which may be transferred by contact from person to person, such as AIDS, gloves of this type are now being used by dentists, police officers, firefighting personnel, beauticians and even highway toll booth attendants.

Disposable gloves have been traditionally made of rubber material such as latex and thermoplastic materials such as vinyl. Latex gloves have been traditionally preferred by surgeons because of their high degree of elasticity which makes them more suitable for prolonged surgical procedures. Plastic gloves have traditionally been lower cost and well suited for routine examinations and many other tasks. Improvements in plastic technology are resulting in plastic gloves with physical properties similar to those of latex gloves so that it is no longer a hard and fast rule as to which type of glove material is more suitable for various procedures. However, all of the above-mentioned glove types, primarily because of their resilient properties and low thickness, have problems with respect to maintaining their position on the wrist of the wearer and not folding down or rolling down during use.

A common method of making disposable gloves is by using a metal form in the shape of a human hand which during the manufacturing process is dipped, with fingers facing downwardly, into a solution of material such as latex or vinyl plastisol which coats the form. The form is removed from the dip tank where it is subsequently subject to heat to promote curing or vulcanizing, or in the case of plastic, fusing into a glove which then may be stripped from the glove form. The art also teaches numerous other forming processes such as passing a heated glove form through a space containing fluidized finally divided particles of polyurethane polymer to produce a glove product as taught in U.S. Pat. No. 4,434,126 to McGary, Jr. et al.

Many of the attempts to eliminate or reduce glove roll down, as taught by the prior art, are achieved by additional steps in the glove forming process while the glove is still on the mold form. Hevner et al., in U.S. Pat. No. 4,133,624, provide a textured wrist portion to help eliminate glove roll down. Schindler, in U.S. Pat. No. 3,852,826, teaches a thin surgical glove provided with a colored circumferential band overlying the cuff portion to provide visual identification of the glove size and to further strengthen the cuff. The process of Schindler is difficult to practice because the glove form must be dipped in a fingers down orientation, and then before curing, the form is partially immersed in a colored latex bath, in a fingers up orientation, wherein the desired width of band is deposited about the cuff portion. It has also been known that rolling the cuff downwardly before stripping the glove from the form will produce a stronger cuff structure which is believed to be less likely to roll down. In U.S. Pat. No. 4,371,987 Braisfield teaches a latex glove with an improved ring rolled cuff which comprises alternating tightly rolled segments with loosely rolled segments.

The problem of roll down is more difficult to solve with gloves made of thermoplastic materials. This is primarily due to the hand-shaped form which, like the human hand, has a circumference substantially smaller at the wrist portion than further down the form toward the fingertips. Because the molded glove is removed from the mold by stripping the gloves cuff section down over the larger portion of the form, a permanent deformation of the plastic material may occur in the cuff area. On a large size glove, for example, a cuff roll molded to a diameter of two and one-half inches may be close to a permanent three inch diameter after stripping from the mold form.

After donning, a glove having a loose fit in the cuff section allows an opportunity for foreign materials to gain entrance to the glove interior thus compromising the amount of protection the glove can provide. In addition, a sloppy glove cuff may tend to fall down the wearer's wrist, reducing protection and presenting an opportunity to be inadvertently stripped from the user's hand during active use. Conversely, an overly tight cuff roll fit such as can be produced by a conventional rubber glove or rubber band inserted in the cuff roll of a plastic glove, may not be desirable either. With its high elastic memory, such a glove could not only cause difficulty in donning but provide increasingly undesirable effects to the user due to possible blood circulation restriction. A glove when worn must be such that it will not impair circulation in the wrist area because such impairment may affect the touch or tactile sense of the hand and the sensitivity of the hand to heat and cold and could possibly procedure hand and finger numbness when worn for a prolonged amount of time such as in a surgical procedure.

The prior art also teaches methods of providing a tighter cuff fit on reusable gloves such as gloves used in athletic competitions where a secure cuff fit is desirable. Typically, these sports gloves have numerous slits or openings which allow the glove to be easily placed on the user's hand and then the cuff portion is usually secured by a strap-like structure having a removable securing device such as Velcro-type fastening material. An example of the sports gloves is taught in U.S. Pat. No. Re. 31,538 to Antonious. Gloves of this type are not suitable for medical procedures and the like because of the numerous vents and openings required by the design and the high cost of the securing means such as Velcro straps or belt and buckle type straps.

Numerous solutions to the problem of loose cuffs and cuff roll-down in gloves have been taught by the prior art. However, there is still a need for a simple, straightforward, reliable, easily fabricated disposable glove for medical use and the like having structure for removably securing the cuff portion of a disposable glove on the hand of the wearer during use without the glove being overly tight or difficult to donn properly. There is also a need for a disposable glove for medical use and the like wherein the fit in the cuff area may be adjusted to suit a wide variety of hand and wrist sizes.

SUMMARY OF THE INVENTION

The disposable glove for medical use and the like of the present invention comprises a closed distal end for containing the wearer's fingers, an open proximal end, and a cuff portion at the open proximal end. A tab at the cuff portion includes a free end. Adhesive means on a portion of the free end of the tab is capable of removably securing the free end to the cuff portion for tightening the cuff portion when the glove is on the wearer's hand.

In a preferred embodiment of the present invention, a disposable glove for medical use and the like comprises a hollow flexible body member including a closed distal end for containing the wearer's fingers, an open proximal end and a cuff portion at the open proximal end. A tab is attached to the cuff portion on the inside of the cuff portion having a free end. The tab projects proximally from the open proximal end of the body portion. Adhesive means on a portion of the free end of the tab is capable of removably securing the free end to the cuff portion. A removable release sheet covering the adhesive means is provided for protecting the adhesive means before time of use. The tab is positioned so that when the glove is properly positioned on the wearer's hand the tab, with release sheet removed, may be pulled in a direction substantially tangent to the open proximal end, and the free end pressed against the cuff portion causing the adhesive means to contact the cuff portion removably securing the free end of the tab to the cuff portion so that the cuff portion is more tightly secured to the wearer than before the free end of the tab was removably secured to the cuff portion.

In another aspect of the present invention, a method of producing a glove including: a hollow flexible body member having a closed distal end for containing the wearer's fingers, an open proximal end, and a cuff portion at the open proximal end; a tab attached to the cuff portion on the inside of the cuff portion having a free end; adhesive means on a portion of the free end of the tab being capable of removably securing the free end to the cuff portion; and a removable release sheet covering the adhesive means for protecting the adhesive means before time of use, comprising the steps of: (1) obtaining a tab covered on one side by adhesive means capable of securing a portion of the tab to the cuff portion and further having a removable release sheet covering the adhesive means; (2) forming a glove on a glove form; (3) removing a portion of the release sheet to exp a portion or the adhesive means; (4) pressing that portion of the tab having the exposed adhesive means against the cuff portion of the glove while the glove is on the mold form; and (5) stripping the glove from the form so that the portion of the body member which was in contact with the mold form is now the exterior of the glove while the portion of the body member, with tab attached, is now the interior of the glove.

In accordance with the principles of the present invention a number of advantages are achieved. Primarily, the present invention provides a simple, straight-forward, reliable, easily fabricated disposable glove for medical use and the like having structure for removably securing the cuff portion of a disposable glove on the hand of a wearer during use without the glove being overly tight or difficult to donn properly. The present invention also provides a disposable glove for medical use and the like wherein the fit in the cuff area may be adjusted to suit a wide variety of wrist sizes. The present invention also provides a method of making a glove having structure for securing the cuff portion on the hand of the wearer during use.

DETAILED DESCRIPTION

While this invention is satisfied by embodiments in many different forms, there is shown in the drawings and will herein be described in detail preferred embodiments of the invention with the understanding that the present disclosure is to be considered as exemplary of the principles of the invention and is not intended to limit the invention to the embodiments illustrated. The scope of the invention will be measured by the appended claims and their equivalents.

Figure 1:
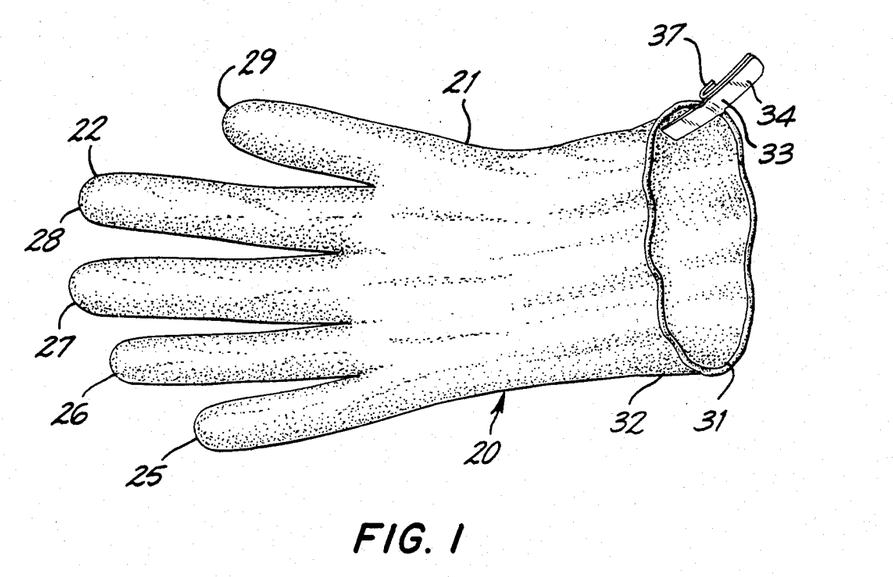
FIG. 1 is a perspective view of a glove having improved cuff securing features of the present invention.
Figure 2:
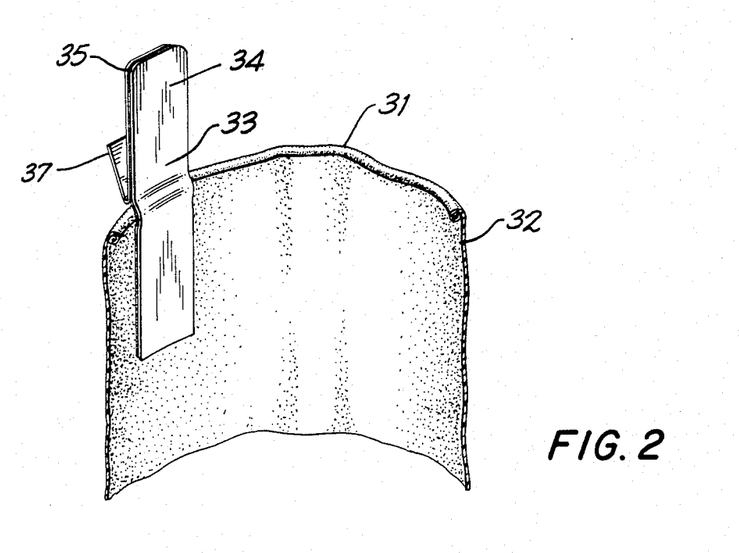
FIG. 2 is a partial cross-sectional view of the glove of FIG. 1 illustrating details of the cuff and tab area.
Figure 3:
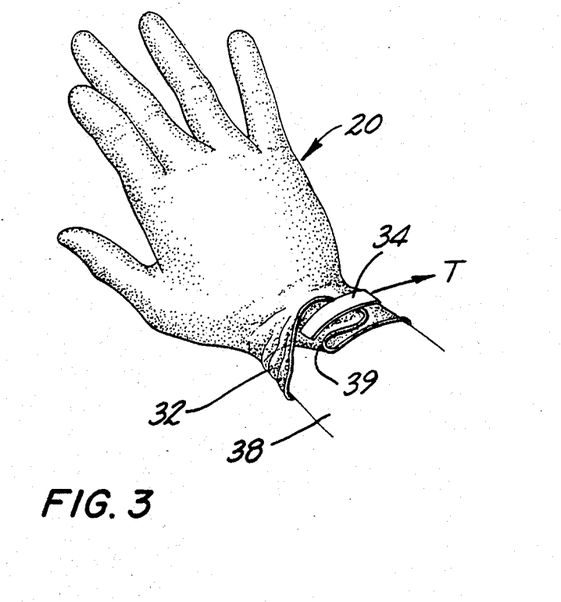
FIG. 3 is a perspective view of the glove of FIG. 1 positioned on the hand of a wearer.

Adverting to FIGS. 1–3, a disposable glove 20 for medical use and the like includes a hollow flexible body member 21 including a closed distal end 22 which in this embodiment is shaped to form five finger receiving receptacles 25–29, an open proximal end 31, and a cuff portion 32 at the open proximal end.

For the purposes of the description of the present invention, the term "distal" is generally meant to refer to that end of the glove which is closest to the wearer's fingertips, whereas the term "proximal" is generally meant to refer to the end of the glove closest to the wearer's wrist.

A tab 33 is attached to the cuff portion on the inside of the cuff portion. Tab 33 includes free end 34. The tab, in this preferred embodiment, projects proximally from open proximal end 31. Adhesive is provided on at least a portion of the free end of the tab and, as will be explained in more detail herein after, is capable of removably securing the free end of the tab to the cuff portion of the glove. Adhesive 35 should be formulated so that will removably attach free end 34 to the cuff portion. A removable release sheet 37 covers adhesive 35 and protects the adhesive before the time of use.

Tab 33 is positioned so that when glove 20 is properly positioned on wearer's hand 38, the tab, with release sheet 37 removed, may be pulled in a direction T substantially tangent to open proximal end 31, and free end 34 pressed against cuff portion 32 causing the adhesive to contact the cuff portion and removably secure free end 34 to cuff portion 32 so that the cuff portion is more tightly secured to the wearer than before the tab was removably secured to the cuff portion. It can be seen that the glove of the present invention can provide a snug fit between the cuff portion of the glove and the use's wrist area for a wide variety of wrist sizes. This feature is not available in prior art references that used additional elastic means to provide a tighter cuff fit. Use of an elastic means will make the cuff tighter on larger wrist wearer's than on smaller wrist wearer's. This disadvantage is overcome by the instant invention. Further, if the adhesive is formulated for repeated usage, the cuff portion may be readjusted if the original position and/or fit does not prove to be as comfortable or as secure as initially desired. At the end of the procedure the free end of the tab may be removed from the cuff portion thus loosening the cuff fit on the wearer's wrist allowing easy removal of the glove for subsequent disposal.

The glove of the present invention eliminates the disadvantages of both the loose cuff and overly tight cuff which may occur on using gloves without the improved cuff securing features of the present invention. By using the glove-attached adhesive backed tab, excess glove material in the cuff area which is folded over and on itself at 39 to provide a secure fit of the glove cuff to the users wrist while at the same time accommodating the individual's unique wrist size.

Although tab 33 of this preferred embodiment is attached to the inside of the cuff portion and projects proximally from open proximal end 31 it is within the purview of the instant invention to include a wide variety of attachment positions for the tab and angular orientations of the tab with respect to the main body such as, but not limited to, attaching the tab on the exterior of the cuff and placing the tab at various angles from proximally projecting to tangentially oriented with respect to the open proximal end of the body member so that the tab is aligned with the force required to removably secure the free end of the tab to the cuff portion. The tab connected to the inside of the open proximal end of the body member and projecting proximally with respect to proximal opening is exemplary of these many possibilities.

It is also within the purview of the present invention to include various methods of attaching tab 33 to cuff portion 32 including using the same adhesive as used on the free end of the tab, or another more aggressive adhesive, heat sealing, mechanical fasteners such as rivets sewing with thread, and the like.

Figure 4:
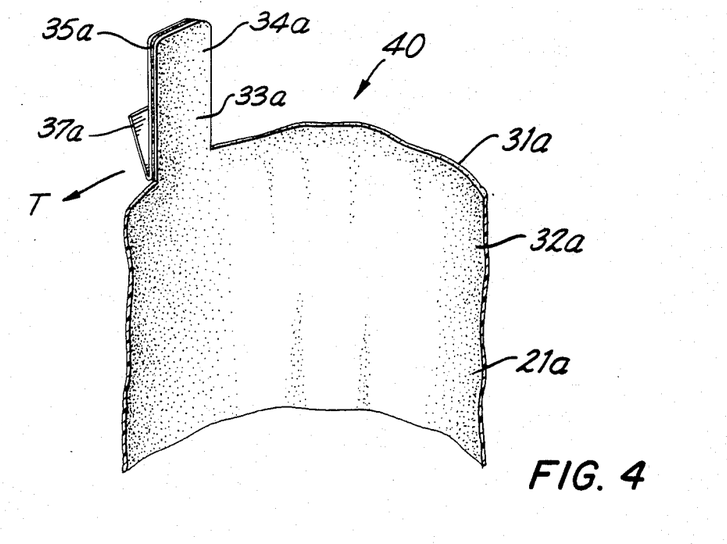
FIG. 4 is a partial cross sectional view of an alternative embodiment of the present invention wherein the tab is integrally formed from the same material as the glove body portion.

FIG. 4 illustrates an alternative embodiment of the disposable glove for medical uses and the like of the instant invention. In this alternative embodiment the structure of the glove is substantially similar to the embodiment of FIGS. 1–3. Accordingly, substantially similar components performing substantially similar functions will be numbered identically to those components in the embodiment of FIGS. 1–3, except a suffix "a" will be used to identify these components in FIG. 4.

A glove 40 includes a hollow flexible body member 21a including a closed distal end [not shown] for containing the wearer's fingers, an open proximal end 31a, and a cuff portion 32a at the proximal end. A tab 33a is integrally formed from the same material as body member 21a and, in this embodiment, projects proximally from the open proximal end. Tab 33a includes free end 34a. Adhesive 35a on the portion of free end 34a of tab 33a is capable of removably securing free end 34a to cuff portion 32a. A removable release sheet 37a covers the adhesive and protects the adhesive before time of use.

Tab 33a is positioned so that when the glove is properly positioned on the wearer's hand [not shown] the tab, with release sheet 37a removed, may be pulled in a direction T substantially tangent to open proximal end 31a, and the free end pressed against the cuff portion for tightening the cuff portion when the glove is on the wearer's hand. In this embodiment the adhesive is on the outside portion of the tab. It is also within the purview of the instant invention to include adhesive on the inside portion of the tab and in the alternative on the cuff portion. With this latter structure the backing sheet would be applied over the adhesive on the cuff portion and the tab could be adhesive free.

Figure 5:
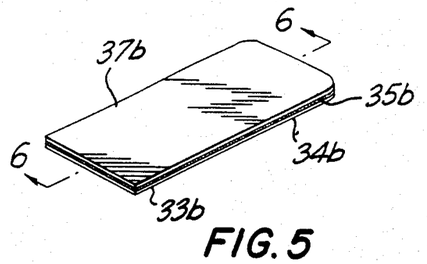
FIG. 5 is a perspective view of a tab having an adhesive coating and a removable release sheet.
Figure 6:
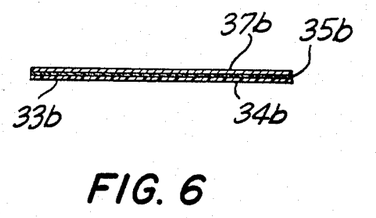
FIG. 6 is a cross-sectional view of the tab of FIG. 5 taken along line 6—6.
Figure 7:
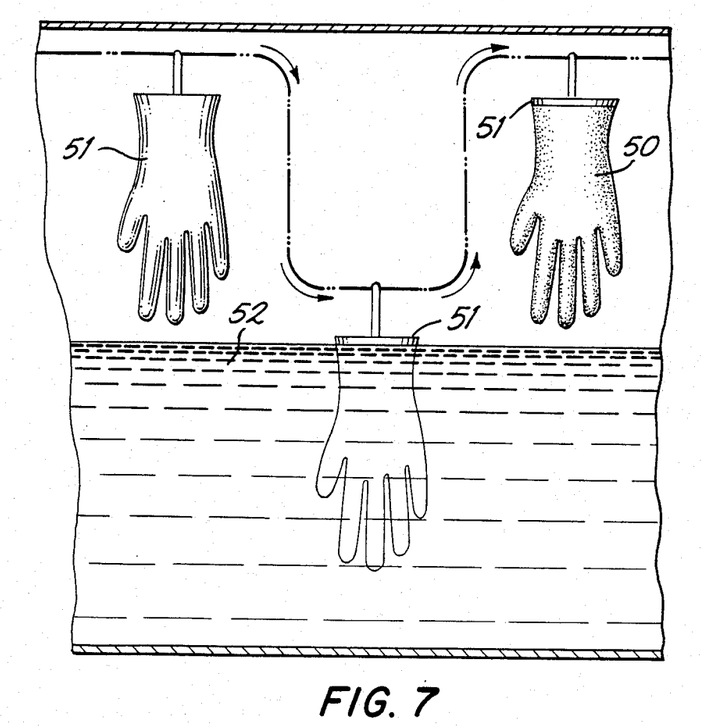
FIG. 7 is a schematic view of a glove forming process using a dip molding method.
Figure 8:
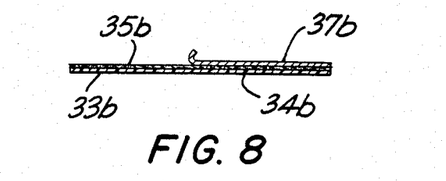
FIG. 8 is a cross-sectional view similar to the cross sectional view of FIG. 6 but with a portion of the backing sheet removed.
Figure 9:
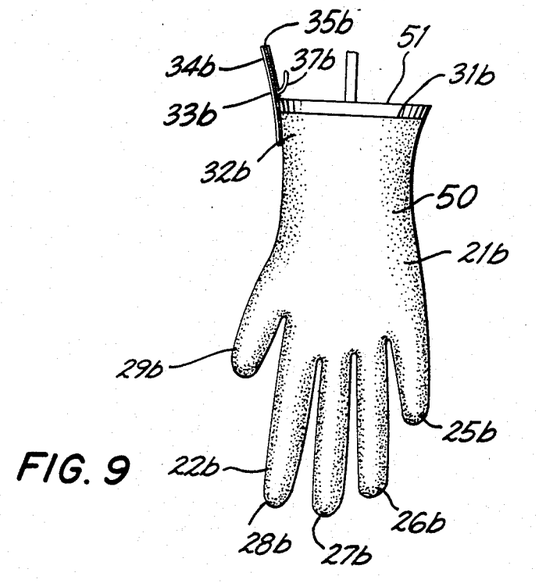
FIG. 9 is a side elevation view illustrating a glove of the present invention still on the mold form.
Figure 10:
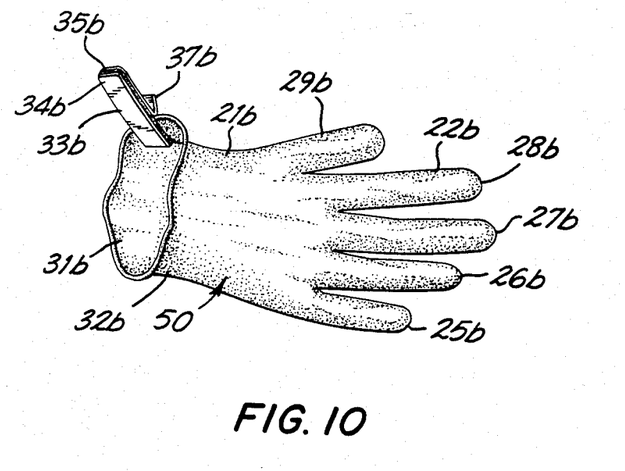
FIG. 10 is a perspective view of the glove of FIG. 9 after being stripped from the mold form.

Adverting to FIGS. 5–10, another aspect of the present invention is a method for producing a glove. The glove produced by the present method is substantially identical to the glove described in FIGS. 1–3. Accordingly, substantially identical components performing substantially identical functions will be numbered identically to those components in the embodiments of FIGS. 1–3, except a suffix [b] will be used to identify these components in FIGS. 5–10. The present invention provides a method for producing the glove 50 including: a hollow flexible body member having a closed distal end 22b which includes finger receiving receptacles 25b–29b, an open proximal end 31b, and a cuff portion 32b at the open proximal end; a tab 33b attached to the cuff portion on the inside of the cuff portion having a free end 34b; adhesive 35b on a portion of free end 34b being capable of removably securing the free end to the cuff portion; and a removable release sheet 37b covering the adhesive for protecting the adhesive before time of use. The method comprises the steps of: (1) obtaining a tab 33b covered on one side by adhesive 35b capable of securing a portion of the tab to the cuff portion of a glove and further having removable release sheet 37b covering the adhesive [as best illustrated in FIG. 5–6]; (2) forming a glove 50 on a form 51 [as best illustrated in FIG. 7]; (3) removing portion of the release sheet to expose a portion of the adhesive [as best illustrated in FIG. 8]; (4) pressing the portion of the tab having the exposed adhesive against the cuff portion of the glove while the glove is on the mold form [as best illustrated in FIG. 9]; and (5) stripping the glove from the mold form so that the portion of the body member which was in contact with the mold form is now the exterior of the glove while the portion of the body member, with tab attached, is now the interior of the glove [as best illustrated in FIG. 10].

It is sometimes desirable to have a donning powder such as talcum powder or absorbable cornstarch on the interior of the glove to enhance the ease of donning. This donning powder can be applied to the exterior of the glove while the glove is on the mold, as illustrated in FIG. 9, after applying the tab to the cuff portion and before stripping the glove from the mold so that donning powder applied to the exterior of the glove while it is on the mold will be on the interior of the glove after it is stripped inside-out off the glove form.

It is within the purview of the present method to include attaching the tab at various angles and orientations from the proximally directed position illustrated in FIGS. 9 and 10 through an orientation which is substantially perpendicular to the orientation indicated in FIGS. 9 and 10.

An alternate method to the preferred method described here and above would be to use a tab (not illustrated) which has a free end and a second end wherein only the free end is covered with adhesive and said adhesive is protected by removable release sheet. In this alternative method, after the glove is formed on the glove form the second end of the tab is attached to the cuff portion using any appropriate means such as ultrasonic welding, a separate different adhesive, rivets or fasteners, heat sealing, or the like, all of which fall within the purview of the method of the present invention.

It should be noted that in forming the glove, as illustrated in FIG. 7, the mold form 51 is dipped into solution 52 and was drawn so that the glove form is coated by the components of the solution such as latex or plastisol. Plastisol is a dispersion of finely divided resin in a plasticizer. Plastisols are used for molding thermoplastic resins such as polyvinyl choride. After removal of the glove form from the solution it is usually subject to heat at another station (not shown) to cure or vulcanize the rubber or to fuse the plastic so that the glove will attain its desired properties. Disposable gloves for medical use or the like have an average thickness within the range of about 0.002" to 0.005" thick. This is an approximate range and it should be noted that various portions of a molded glove such as between the fingers or at the finger tips may be substantially thinner or thicker than the overall areas formed on the mold where the mold has a large radius of curvature. Some manufacturers even specify the thickness of the glove based on the thickest portions rather than the average.

The gloves and the methods contained of the present invention may be made of material selected from the group of natural rubber, synthetic rubber, thermoplastic elastomers, thermoplastic, natural rubber latex, synthetic rubber latex and mixtures of natural rubber latex and synthetic rubber latex. If a thermoplastic material is selected, plasticized polyvinyl chloride (hereinafter referred to as polyvinyl chloride or vinyl) and polyurethane are preferred materials.

It is also within the purview of the instant invention to include gloves which are not molded but are fabricated using parallel layers of flexible thermoplastic films which are heat sealed together along a line which describes a glove shape, for example a five finger glove. Portions of the thermoplastic materials outside of the heat seal are stripped away leaving a glove which has a heat seal seam running approximately through the center line of all of the fingers. Gloves of this type are a very low cost type of glove frequently found in hair care products such as kits for hair color change. The tab structure of the present invention is ideally suited for this type of low cost glove.

It is also within the purview of the instant invention to include gloves made of multiple layers bonded together such as a glove made of at least one layer of latex rubber bonded to at least one layer of thermoplastic material. Such multi-layer structures are taught in U.S. Pat. No. 3,382,138 to Barth. In a multi-layered glove structure the preferred materials are at least one layer of latex bonded to at least one layer of polyurethane or polyvinyl chloride.

A wide variety of materials are suitable for forming the tab with thin sheet or film material selected from the group of polyester, polyethylene and polyvinyl chloride being desirable with polyethylene being preferred. The tab may even be constructed of a paper or of metal foil. The choice of tab material will be greatly influenced by the choice of adhesive, the glove material chosen and the method of attaching the tab to the cuff portion. Tabs made of thermoplastic film having a thickness within the range of about 0.001 inch -0.003 inch are desirable.

A wide variety of materials are suitable for adhesive with water based acrylic adhesive being desirable. Again, the choice of adhesive will depend on the choice of tab material and glove formulation. The adhesive should allow the free end of the tab to be removably secured to the cuff portion, preferably several times so that the user may change the cuff fit if the original setting is not proper or becomes uncomfortable or too loose.

A wide variety of materials are suitable for formulation of the release sheet wherein the choice is primarily determined by the choice of adhesive. Silicone impregnated paper is a desirable release sheet for use with water based acrylic adhesive.

The combination of the tab, adhesive and backing sheet may be purchased in a dye cut laminate ready to use from any manufacturers, such as Imperial Marking Systems, Union City, Calif. 94587. Because the free end of the tab functions in a similar manner to an adhesive backed label, information and sources regarding these materials is readily available. Commonly available adhesive backed tape such as Scotch TM brand tape available from 3M, St. Paul, Minn. 55144, with the suitable backing sheet, may function well as a tab on some glove cuff materials.

It is sometimes desirable for all of the elements of the glove of the present invention to be sterile when used. When sterility is a requirement, materials should also be selected for compatibility with the sterilization process being used.

Thus it can be seen that the present invention provides a simple, straight-forward, reliable, easily fabricated disposable glove for medical use and the like having structure for securing the cuff portion of the glove on the hand of the wearer during use without the glove being overly tight or difficult to donn properly. The present invention also provides a disposable glove for medical use and the like wherein the fit in the cuff area may be adjusted to suit a wide variety of wrist sizes.

What is claimed is:

1. A glove comprising:
    a hollow formed seamless flexible body member including a closed distal end for containing the wearer's fingers, an open proximal end, and a cuff portion at said proximal end;
    a tab attached to said cuff portion having a free end, said tab projecting proximally from said open proximal end;
    adhesive means on a portion of said free end of said tab being capable of removably securing said free end to said cuff portion;
    said tab being positioned so that when said glove is properly positioned on the wearer's hand said tab may be pulled in a direction substantially tangent to said open proximal end, and said free end pressed against said cuff portion causing said adhesive means to contact said cuff portion removably securing said free end of said tab to said cuff portion so that said cuff portion is more tightly secured to the wearer than before said tab was removably secured to said cuff portion.

2. The glove of claim 1 wherein said closed distal end is shaped to form five finger receiving receptacles.

3. The glove of claim 1 wherein said tab is attached to said cuff portion on the inside of said cuff portion.

4. The glove of claim 1 wherein said tab is made of thin sheet material selected from the group of polyester, polyethylene and polyvinyl chloride.

5. The glove of claim 1 wherein said adhesive means includes water based acrylic adhesive.

6. The glove of claim 1 wherein said adhesive means is covered by a removable release sheet for protecting said adhesive means before time of use.

7. The glove of claim 6 wherein said release sheet is made of silicone impregnated paper.

8. The glove of claim 1 wherein said body member is made of material selected from the group of natural rubber, synthetic rubber, thermoplastic elastomer, thermoplastics, natural rubber latex, synthetic rubber latex and mixtures of natural rubber latex and synthetic rubber latex.

9. The glove of claim 8 wherein said body member is made of thermoplastic material selected from the group of polyvinyl chloride and polyurethane.

10. The glove of claim 1 wherein said body member is made of at least one layer of latex rubber bonded to at lease one layer of a thermoplastic material.

11. The glove of claim 10 wherein said thermoplastic material is selected from the group consisting of polyurethane and polyvinyl chloride.

12. The glove of claim 1 wherein said body member has an average thickness within the range of about 0.002 inches to 0.005 inches.

13. A formed seamless disposable glove for medical use and the like comprising:
   a closed distal end for containing the wearer's fingers, an open proximal end, and a cuff portion at said open proximal end;
   a tab at said cuff portion having a free end, said tab projecting proximally from said open proximal end;
   adhesive means on a portion of said tab being capable of removably securing said free end to said cuff portion for tightening said cuff portion when said glove is on the wearer's hand.

14. A disposable glove for medical use and the like comprising:
   a hollow formed seamless flexible body member including a closed distal end for containing the wearer's fingers, an open proximal end, and a cuff portion at said open proximal end;
   a tab attached to said cuff portion on the inside of said cuff portion having a free end, said tab projecting proximally from said open proximal end
   adhesive means on a portion of said free end of said tab being capable of removably securing said free end to said cuff portion;
   a removable release sheet covering said adhesive means for protecting said adhesive means before time of use;
   said tab being positioned so that when said glove is properly positioned on the wearer's hand said tab, with release sheet removed, may be pulled in a direction substantially tangent to said open proximal end, and said free end pressed against said cuff portion causing said adhesive means to contact said cuff portion removably securing said free end of said tab to said cuff portion so that said cuff portion is more tightly secured to the wearer than before said tab was removably secured to said cuff portion.

15. The glove of claim 14 wherein said body member has an average wall thickness of within the range of about 0.002 to 0.005 inches.

16. The glove of claim 14, wherein said glove is made of a thermoplastic material.

17. A method of making a glove including: a hollow flexible body member having a closed distal end for containing the wearer's fingers, an open proximal end, and a cuff portion at said open proximal end; a tab attached to said cuff portion on the inside of said cuff portion having a free end; adhesive means on a portion of said free end of said tab being capable of removably securing said free end to said cuff portion; and a removable release sheet covering said adhesive means for protecting said adhesive means before time of use, comprising the steps of:
   (1) obtaining a tab covered on one side by adhesive means capable of securing a portion of said tab to said cuff portion and further having a removable release sheet covering said adhesive means;
   (2) forming a glove on a glove form;
   (3) removing a portion of said release sheet to expose a portion of said adhesive means;
   (4) pressing the portion of said tab having the exposed adhesive means against said cuff portion of said glove while said glove is on the mold form; and
   (5) stripping said glove from said mold form so that the portion of said body member which was in contact with the mold form is now the exterior of said glove while the portion of the body member, with tab attached, is now the interior of said glove.

18. The method of claim 17 further including the step of applying a donning powder to the glove after the pressing step and before the stripping step.

19. The method of claim 18 wherein the donning powder is absorbable cornstarch.

20. The method of claim 17 wherein the tab is positioned in said pressing step so that a portion of the tab having the release sheet attached projects proximally from said open proximal end of said body member.

21. The method of making a glove including: a hollow flexible body member having a closed distal end for containing the weare's fingers, an open proximal end, and a cuff portion at said open proximal end; a tab attached to said cuff portion on the inside of said cuff portion having a free end; adhesive means on a portion of said free end of said tab being capable of removably securing said free end to said cuff portion; and a removable release sheet covering said adhesive means for protecting said adhesive means before time of use, comprising the steps of:
   (1) obtaining a tab having a free end covered on one side by adhesive means capable of securing a portion of said tab to said cuff portion and further having a removable release sheet covering said adhesive means;
   (2) forming a glove on a glove form;
   (3) attaching said second end of said tab to said cuff portion of said glove while said glove is on the mold form;
   (4) stripping said glove from said mold form so that the portion of said body member which was in contact with the form is now the exterior of said glove while the portion of the body member, with tab attached, is now the interior of said glove;

22. The method of claim 21 further including the step of applying a donning powder to the glove after the attaching step and before the stripping step.

23. The method of claim 21 wherein the tab is positioned in said attaching step so tht said free end of said tab projects proximally from said open proximal end of said body member.

24. A glove comprising:
- a hollow flexible body member including a closed distal end for containing the wearer's fingers, and open proximal end, and a cuff portion at said proximal end;
- a tab at said cuff portion having a free end said tab being integrally formed of the same material as said body member;
- adhesive means on a portion of said free end of said tab being capable of removable securing said free end to said cuff portion;
- said tab being positioned so that when said glove is properly positioned on the wearer's hand said tab may be pulled in a direction substantially tangent to said one proximal end, and said free end pressed against said cuff portion causing said adhesive means to contact said cuff portion removable securing said free end of said tab to said cuff portion so that said cuff portion is more tightly secured to the wearer than before said tab was removable secured to said cuff portion.

25. The glove of claim 24 wherein said tab projects proximally from said open proximal end.

* * * * *